United States Patent
Benayoun et al.

[11] Patent Number: 6,067,381
[45] Date of Patent: May 23, 2000

[54] METHOD OF REINITIALIZING DICTIONARIES IN A DATA TRANSMISSION SYSTEM USING DATA COMPRESSION

[75] Inventors: Alain Benayoun, Cagnes Sur Mer; Patrick Michel, La Gaude; Jacques Fieschi, Saint Laurent Du Var; Jean-Francois Le Pennec, Nice, all of France

[73] Assignee: International Business Machines Corporation, Armonk, N.Y.

[21] Appl. No.: 09/067,457

[22] Filed: Apr. 28, 1998

[30] Foreign Application Priority Data

Jun. 13, 1997 [EP] European Pat. Off. ............. 97480033

[51] Int. Cl.[7] .............................. G06K 9/36; H03M 7/34
[52] U.S. Cl. ..................... 382/232; 382/239; 382/246; 341/51
[58] Field of Search .................... 382/232, 239, 382/229, 246; 341/51, 50, 67, 52, 59, 60, 94, 106; 714/758, 752, 746

[56] References Cited

U.S. PATENT DOCUMENTS

| | | | |
|---|---|---|---|
| 5,298,895 | 3/1994 | Van Maren | 341/51 |
| 5,373,290 | 12/1994 | Lempel et al. | 341/51 |
| 5,375,204 | 12/1994 | Motoyama et al. | 341/51 |
| 5,485,526 | 1/1996 | Tobin | 382/232 |

FOREIGN PATENT DOCUMENTS 09224018  8/1997  Japan ............................ H04L 1/18

*Primary Examiner*—Thomas D. Lee
*Assistant Examiner*—Wen Peng Chen
*Attorney, Agent, or Firm*—John J Timar; John D Flynn

[57] ABSTRACT

Method of reinitializing dictionaries in a data transmission system using data compression having a transmit device and a receive device, and in which strings of characters have to be transmitted in a compressed form, the transmit device having a transmit dictionary storing codewords associated with the strings of characters which are transmitted instead of the strings of characters, the receive device having a receive dictionary storing codewords associated with the strings of characters, and both dictionaries being updated each time a new string of characters has to be transmitted so that the contents of the dictionaries remain identical. This method saves at least the addresses of the parts of the transmit or receive dictionary which have to be modified by a dictionary updating operation, builds a check message based upon the contents of the transmit dictionary updated by the dictionary updating operation, transmits the check message from the transmit device to the receive device, and then deletes in both dictionaries the parts which are determined by the saved addresses in the event that the check message does not correspond to the contents of the updated receive dictionary. This enables both dictionaries to be reinitialized in an intermediate state without being reset.

8 Claims, 4 Drawing Sheets

METHOD OF REINITIALIZING DICTIONARIES IN A DATA TRANSMISSION SYSTEM USING DATA COMPRESSION

TECHNICAL FIELD

The present invention relates to a data transmission system wherein data are transmitted from a transmit device to a receive device in a compressed form and more particularly to a method of reinitializing the transmit and receive dictionaries without clearing them in case of data transmission errors.

BACKGROUND ART

In a data transmission system, modems communicate with each other by using a modulation method which translates digital data into analog signals and reciprocally. In the handshake procedure, the modems agree on a modulation technique and then they may try to negotiate an error-detection and correction method. If they agree on an error-detection and correction method, they may incorporate a data compression method to increase the effective throughput of data beyond the actual correction speed. Compression is possible only if error correction is also being done and the interface speed between the data terminal equipment and the modem is higher than the connection speed between the two modems.

When using error correction or compression it is essential to enable an effective form of flow control between each modem and the DTE it is directly connected to. Without effective flow control, data will be lost when one device sends data faster than the other one can receive it. Thus, flow control between the two modems can be handled by the error correction protocol V42.

Using V42 protocol between two modems and therefore between two DTEs results in an error free data transmission. When the transmission between two DTEs is error free, it is possible to use data compression which does not tolerate errors. V42bis protocol is used to compress the data flow before giving it to the error control function and decompress the data in the reverse way.

The V42bis data compression method is based on the Ziv-Lempel algorithm disclosed in an article entitled "Compression of individual sequences via variable rate coding" by Ziv and Lempel published in the IEEE Transactions on Information Theory IT 24 pp 530–536. In this algorithm, the encoding mechanism is based on the use of a codeword having limited length for each string of characters. Each character which is received from the DTE through the interchange circuit is associated with a string of characters represented by a characterizing codeword. This process maintains a transmit dictionary in which strings of characters are stored with their corresponding codeword. The transmit dictionary is dynamically updated in the course of the encoded mechanism. The codewords which are received from the modem through the error control functions are then decoded by the decoding mechanism in order to regenerate the original string of characters. To achieve this, a receive dictionary associated with the decoding mechanism is also updated so that the two dictionaries on each side of the interchange circuit remain identical.

A method for data compression of strings of characters is described in the European Patent application 94 480176.0. According to this method, each codeword stored in the memory corresponds to four distinctive fields: a first field defining the index or the codeword of the last character of the current string being addressed in the memory, a second field defining the index or the codeword of the string (SON) that comprises the current string plus an additional character and which is the first string whose creation chronologically follows that of the current string being accessed in the memory, a third field defining the index or the codeword of the string (BROTHER) which appears within the dictionary after the creation of the current string being accessed in the memory and which has the same common characters as the current string except for the last, and a fourth field defining the index of the string (PARENT) that comprises all the characters of the current string except the last.

When each of the two dictionaries storing the codewords is initialized, it is empty. As a codeword always contains more than 8 bits, the compression ratio is always less than 1 as illustrated in FIG. 1. Then, as the codewords are able to represent a plurality of data bytes associated with a string of characters, the ratio is improved and becomes more than 1. When the dictionary is full, that is, when the compression ratio is above the level of dictionary saturation, it is more and more difficult to improve the ratio as the process is more complex and the codewords need to be replaced by new ones (delete and update area).

In case of a transmission error, there is a discrepancy between the contents of both the transmit dictionary and the receive dictionary, and the latter are reset to the initial condition. Assuming that this error occurs when the compression ratio is high as illustrated in FIG. 1, such a resetting causes the performance to be degraded while the dictionary is being rebuilt.

SUMMARY OF THE INVENTION

The object of the invention is therefore to provide a method of reinitializing the dictionaries used for data compression in a data transmission system without automatically resetting the dictionaries in case of a transmission error.

Accordingly, the invention relates to a method of reinitializing dictionaries in a data transmission system using data compression comprising a transmit device and a receiver device in which strings of characters have to be transmitted in a compressed form from the transmit device to the receive device; the transmit device having a transmit dictionary storing codewords associated with the strings of characters which are transmitted instead of the strings of characters from the transmit device to the receive device; the receive device having a receive dictionary storing codewords associated with the strings of characters, and both transmit and receive dictionaries being updated each time a new string of characters has to be transmitted so that the contents of the dictionaries remain identical. This method comprises the following steps:

a) saving at least the addresses of the parts of the transmit or receive dictionary which have to be modified by a dictionary updating operation, b) building a check message (CRC) based upon the contents of the transmit dictionary updated by the dictionary updating operation, and transmitting it from the transmit device to the receive device, and c) deleting in the transmit and receive dictionaries the parts which are determined by the saved addresses in case the check message does not correspond to the contents of the updated receive dictionary, whereby both transmit and receive dictionaries are reinitialized in an intermediate state without being reset.

According to an important feature of the invention, an acknowledgment is transmitted from the receive device to the transmit device for determining whether the check message corresponds to the contents of the updated receive dictionary.

According to one embodiment of the invention, the addresses of the parts of the transmit or receive dictionary which have to be modified are saved in the empty locations associated with the addresses corresponding to the basic characters in the dictionary.

According to another alternate embodiment of the invention, the parts of the transmit or receive dictionary which have to be modified by a dictionary updating operation are also saved, and in case of transmission error, the parts of the dictionaries which have been modified during the dictionary updating operation are replaced in both dictionaries by the parts which have been previously saved.

BRIEF DESCRIPTION OF THE DRAWINGS

The objects and features of the invention will be clear from the following description of the best embodiment when read in reference to the accompanying drawings wherein.

DETAILED DESCRIPTION OF THE PREFERRED EMBODIMENT

Figure 1:
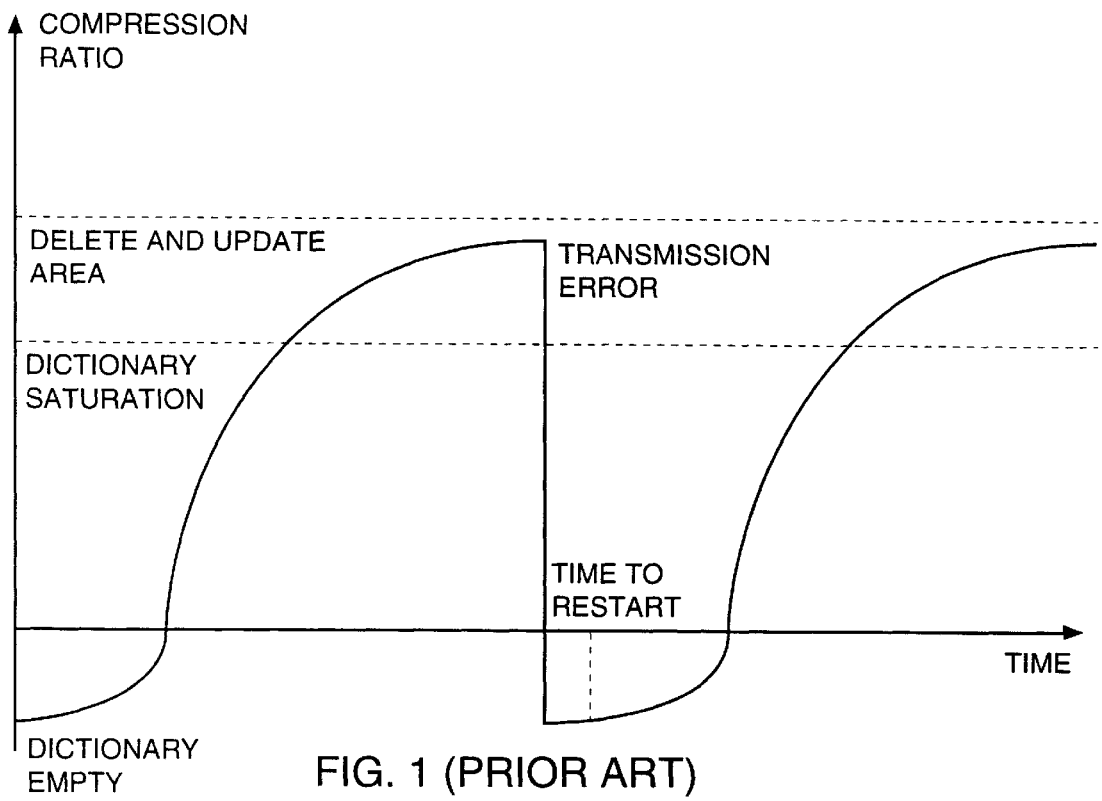
FIG. 1 represents a diagram of the compression ratio with respect to the time when a transmission error occurs in a prior art system.
Figure 2:
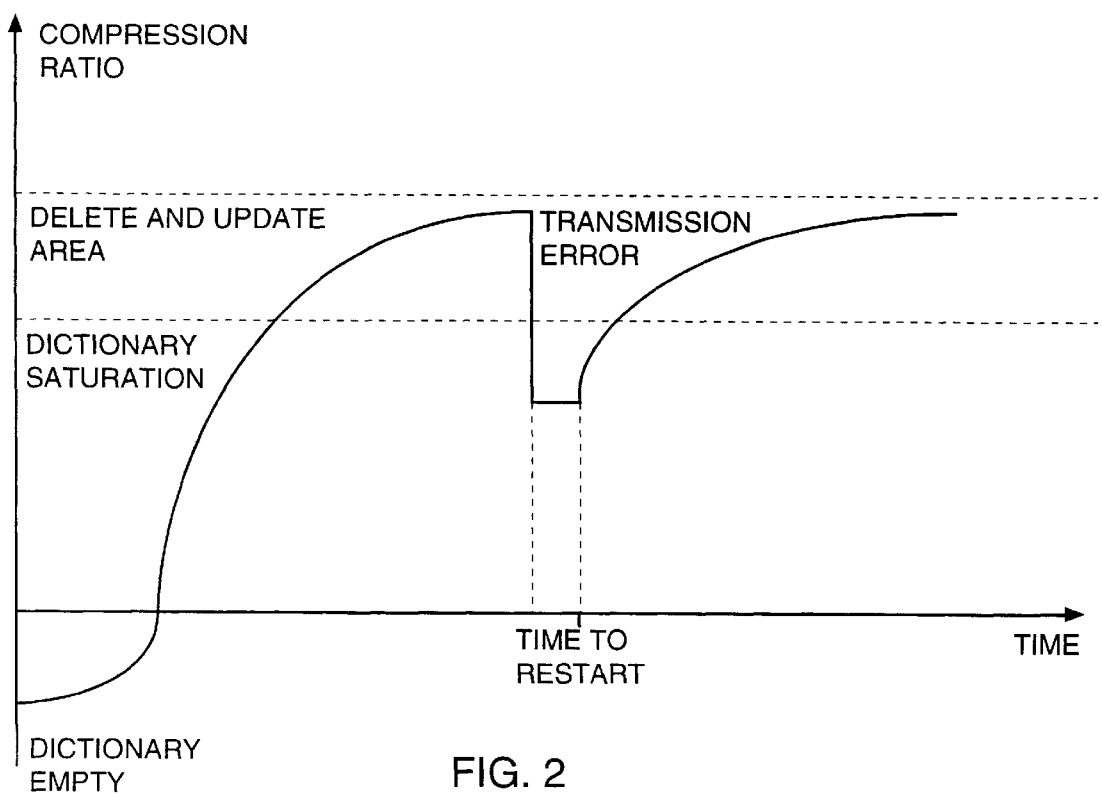
FIG. 2 represents a diagram of the compression ratio with respect to the time when a transmission error occurs with the method of the invention.

As mentioned here above in reference to FIG. 1, when a transmission error occurs, the prior art technique consisting of resetting all the dictionaries storing the codewords used for the data transmission had the drawback of considerably degrading the performance of the data transmission system. With the method of the invention as described below, the full dictionary is not reset when a transmission error occurs. Instead, each dictionary (transmit and receive) is reinitialized from an intermediate value that the system is able to recover on both sides. As illustrated in FIG. 2, the compression ratio is increased at a value which is near the value corresponding to the dictionary saturation and not at a value less than 1 as in the prior technique. Therefore, except during the time necessary to identify the failure and to retrieve a valid context where no data can be sent (represented by the horizontal line between the two curves), the system resumes with a higher compression ratio, thus improving the average compression ratio.

Figure 3:
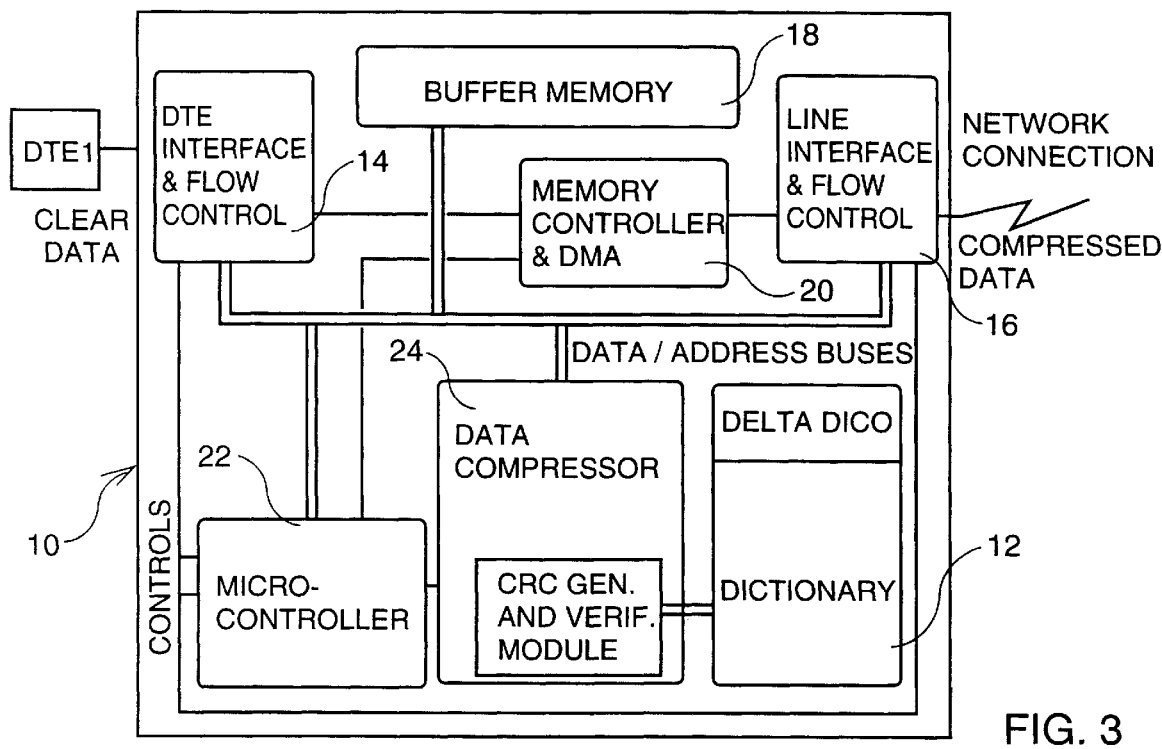
FIG. 3 is a block-diagram of a node with all the features used to implement the method of the invention.

To implement the method of the invention, the transmit node 10 (as well as the receive node) illustrated in FIG. 3 includes a portion of memory 12 which is dedicated to a delta dictionary (Delta Dico) wherein the parts of the dictionary which have to be modified by a dictionary updating operation are saved. For example, if the memory dedicated to the dictionary has a capacity of 8K bytes, the portion of the memory in which the delta dictionary is stored has a capacity which is 10% of the dictionary capacity, that is, about 1K bytes.

Such an operation takes place each time a new string of characters has to be transmitted from the transmit node to the receive node. Assuming that a transmission error occurs, the dictionary of the receive node is no longer identical to the dictionary of the transmit node. In such a case, the algorithm in accordance with the invention replaces in both transmit and receive dictionaries the parts which have been modified before the data transmission occurs by the data which have been saved in the respective delta dictionaries of the transmit and receive nodes whereby the contents of the two dictionaries are again identical. The node further comprises a DTE Interface and Flow Control unit 14 connected to the DTE, a LINE Interface and Flow Control unit 16 connected to the network, a buffer memory 18 to store both clear and compressed data received from both sides, a memory controller and DMA unit 20 to perform fast data transfers between DTE Interface and Flow Control unit 14 and memory 12 on the one hand, and between LINE Interface and Flow Control Unit 16 and memory 12 on the other hand.

Transmit node 10 also includes a microcontroller 22 for the initialization and protocol control on both sides and a data compressor unit 24 which performs the compression of data stored in buffer memory 18 using the dictionary stored in memory 12.

Figure 4:
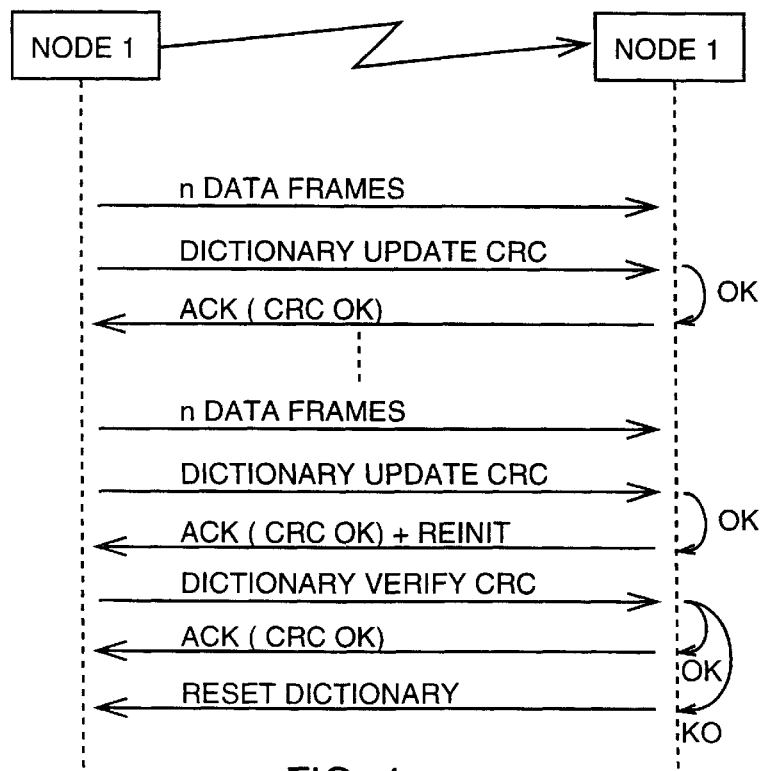
FIG. 4 is a schematic representation of the different steps implemented in the method of the invention.

To manage the dictionary updating operation between NODE 1 and NODE 2, the method according to the invention is illustrated in FIG. 4. First, a stream of n data frames is transmitted from the transmit node to the receive node before a dictionary update CRC is transmitted in the same way. If the CRC received by the receive node is identical to the dictionary update CRC built by the receive node, an acknowledgment signal ACK (CRC OK) is sent back from the receive node to the transmit node. But, if the CRC received by the receive node is not identical to the dictionary update CRC built by the receive node, this means that a transmission error occurred and an acknowledgment signal ACK (CRC KO) is sent back to the transmit node. At the same time, the receive node sends an intermediate reinitializing to the transmit node which requests it to replace all the parts of the transmit dictionary which have been modified during the last updating by the parts of the dictionary which had been previously saved in the delta dictionary (see FIG. 3). Note the same operation takes place in the receive node.

Then, a dictionary verify CRC is transmitted from the transmit node to the receive node to make sure that the transmit and receive dictionaries which have just been reinitialized are now identical. If so, a signal ACK (CRC OK) is sent back to the transmit node. If not, a command of resetting the transmit dictionary is sent back while the receive dictionary is also reset. It must be noted that the number n of data frames which are forwarded before a dictionary update CRC is transmitted, determines the frequency at which the dictionaries are checked. The higher this number n is, the longer the interval of time without a dictionary update check becomes, and the higher the risk of transmission error occurring during this time interval. Furthermore, a very large window size n requires having a large delta dictionary and results in substantial processing time in case of transmission error. This is why it is necessary to choose a number n which is a trade-off to obtain a frequency of reinitializing of the dictionaries which does not spend too much processing time with respect to the total transmission time and which results in good accuracy for the data transmission.

Figure 5:
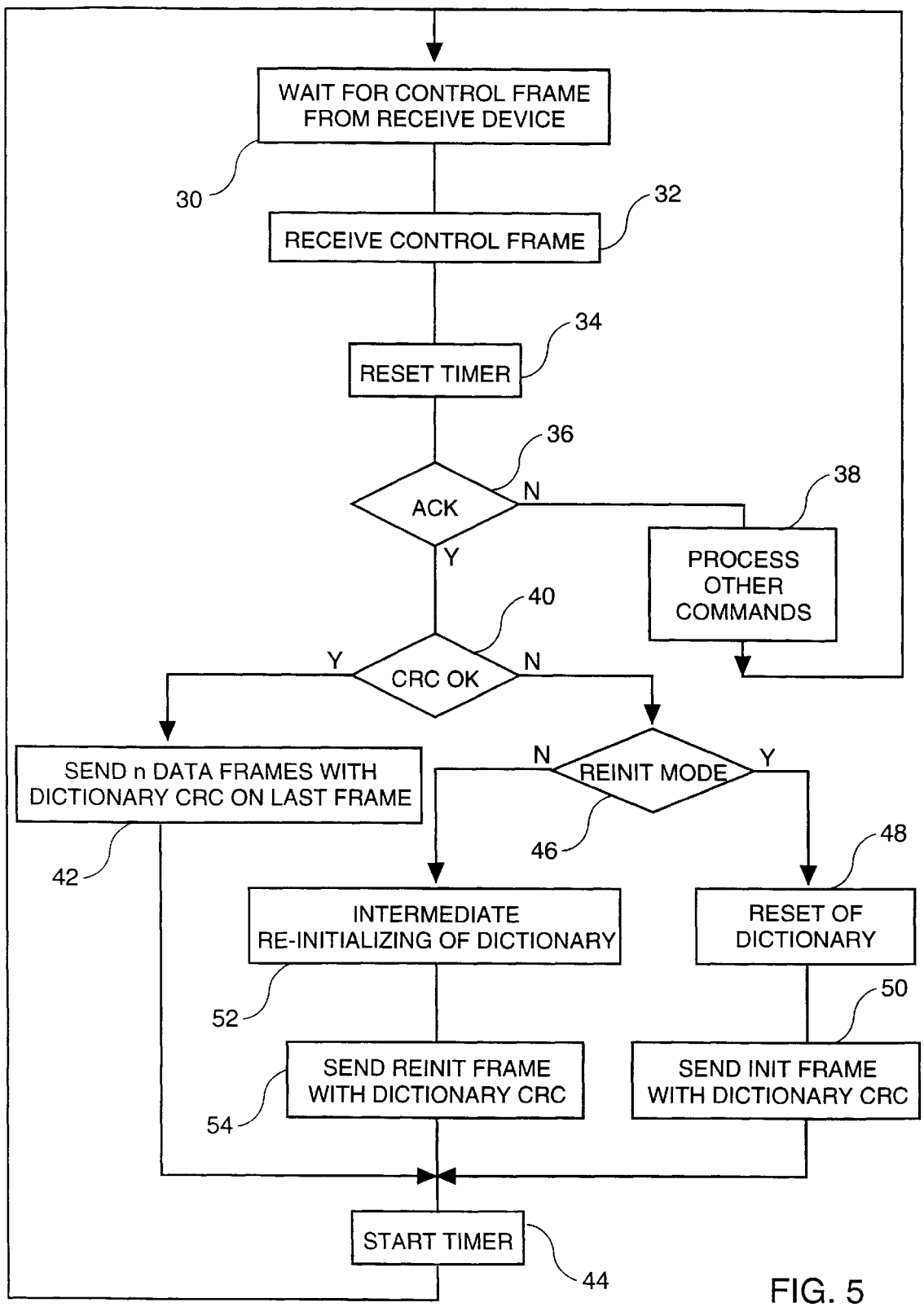
FIG. 5 is a flow chart showing the different steps of the method according to the invention which are implemented in the transmit device.
Figure 6:
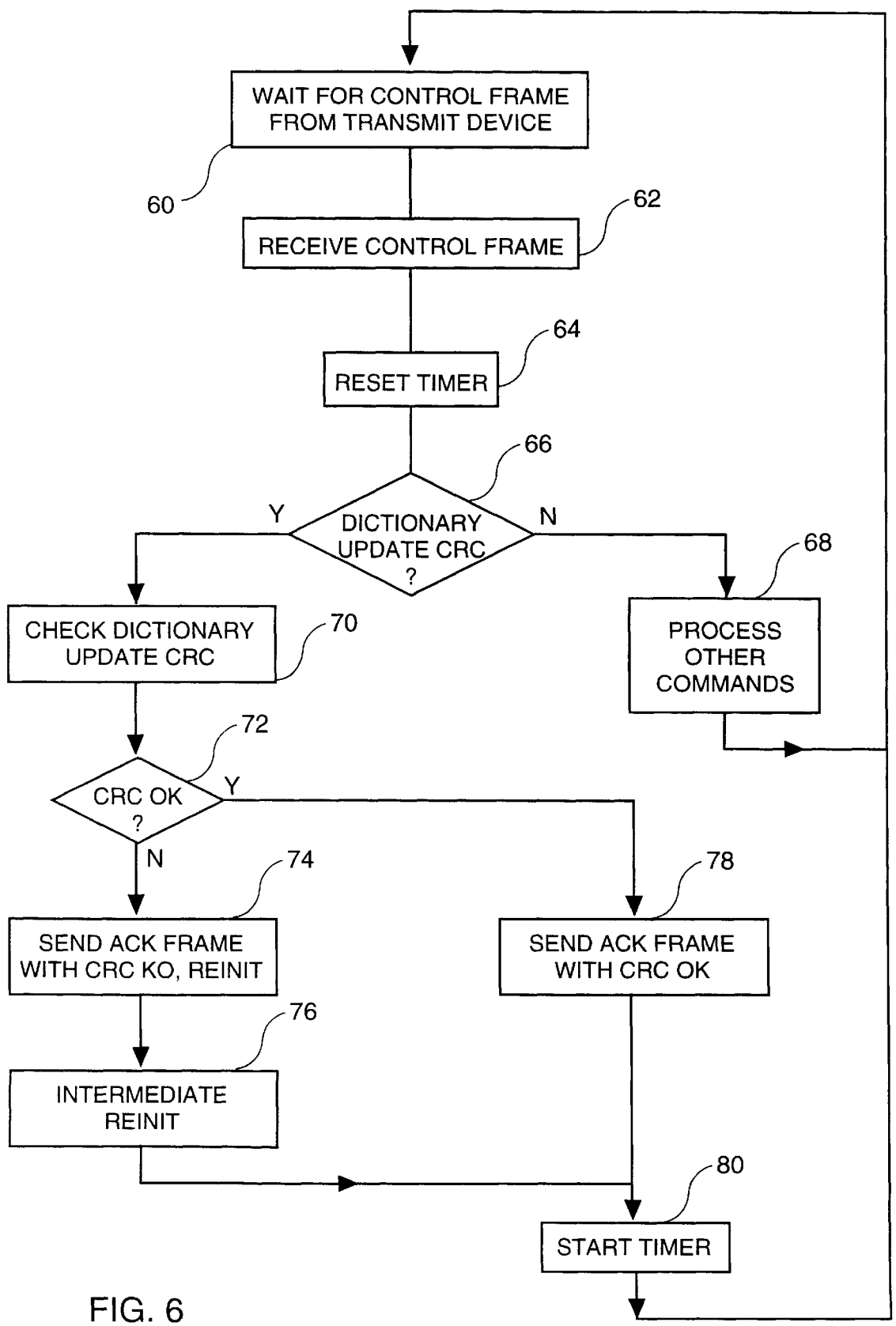
FIG. 6 is a flow chart showing the different steps of the method according to the invention which are implemented in the receive device.

The above method is now described for both the transmit and receive nodes in reference to FIGS. 5 and 6 respectively. For the transmit side, the node waits for a control frame from receive device (block 30). Such a control frame can be of different types such as CHECK, ACK, INIT, etc. When a CONTROL FRAME is received (block 32), a transmit timer is reset (block 34). When a control frame with an ACK signal is received (block 36), the process verifies that the contents of the ACK gives information about CRC. If not, other commands are processed (block 38) and the algorithm can start again. When the ACK signal relates to a CRC, the process verifies whether or not such a CRC is OK (block 40). If the CRC is OK, the receive device sends n new data frames with a dictionary CRC on the last frame (block 42) before starting the transmit timer (block 44). If the ACK signal indicates that CRC is not OK, a test is performed to verify whether the transmit node is already in the REINIT mode (block 46). If so, this means that a command of reinitializing the dictionaries has already been set. In such a case, a command of resetting the transmit dictionary is set (block 48) while an INIT FRAME with dictionary CRC is sent to the receive device (block 50) in order to also reset the receive dictionary. If the REINIT mode has not yet been set, this means that it is the first bad CRC check since the last data transmission. In such a case, an intermediate re-initializing of the transmit dictionary takes place (block 52) and a control message REINIT FRAME is forwarded to the receive message together with the new dictionary CRC (block 54); at the same time, a flag is set to indicate that the REINIT mode has been entered, such a flag being reset when a CRC KO is received.

For the receive side, the node waits for a control message from the transmit device (block 60). Such a control frame can be of different types such as CHECK, ACK, INIT, etc. When a CONTROL FRAME is received (block 62), a receive timer is reset (block 64). At this time, a test is made (block 66) to check whether a dictionary update CRC has been received. If not, other commands are processed (block 68) and the algorithm can start again. If a dictionary update CRC has been received, a check dictionary update CRC is built with the contents of the receive dictionary. Then, a test is made (block 72) to check whether the check dictionary update CRC corresponds to the received, dictionary update CRC. If not, the receive node sends an ACK frame with the indication CRC KO and the command REINIT to the transmit node (block 74), and a reinitializing of the receive dictionary takes place by initiating an INTERMEDIATE REINIT (block 76). If so, this means that the contents of both transmit and receive dictionaries are identical, and therefore, an ACK frame with CRC OK is sent back to the transmit node (block 78). Finally, the timer is started (block 80) before repeating the entire process again.

It must be noted that, according to an alternative embodiment of the invention, the contents of the dictionary which have been updated, are not saved in a delta dictionary, but only the addresses of the updated parts are saved. When a transmission error occurs, the REINIT command causes the updated parts of the dictionary the addresses of which have been saved to be deleted. The drawback of this embodiment is that the dictionary is not reinitialized at the state it was in before the transmission error occurs, but at a previous state for which the dictionary did not contain the codewords corresponding to the more recent strings of characters to be transmitted. However, such an embodiment presents the advantage of requiring a fewer number of elements to be saved, that is, only the addresses modified. It is thus possible to save the updated addresses in the empty locations associated with the first 256 addresses corresponding to the basic characters in the dictionary since these locations do not contain addresses for parent and brother.

While the invention has been particularly shown and described with reference to preferred embodiments thereof, it will be understood by those skilled in the art that various other changes in form and detail may be made without departing from the spirit and scope of the invention.

What is claimed is:

1. A method of reinitializing dictionaries in a data transmission system using data compression, said system comprising a transmit device and a receive device and wherein strings of characters have to be transmitted in a compressed form from said transmit device to said receive device, said transmit device having a transmit dictionary storing codewords associated with said strings of characters which are transmitted instead of said strings of characters from said transmit device to said receive device, said receive device having a receive dictionary storing codewords associated with said strings of characters, and said transmit and receive dictionaries being updated each time a new string of characters has to be transmitted so that the contents of both dictionaries remain identical;

said method comprising the following steps:
  (a) saving at least the addresses of the parts of said transmit or receive dictionary which have to be modified by a dictionary updating operation;
  (b) building a CRC check message based upon the contents of said transmit dictionary updated by said dictionary updating operation, and transmitting it from said transmit device to said receive device; and
  (c) deleting in said transmit and receive dictionaries the parts which are determined by said saved addresses in case said CRC check message does not correspond to the contents of the updated receive dictionary, whereby both transmit and receive dictionaries are reinitialized in an intermediate state without being reset.

2. The method according to claim 1 wherein the addresses of the parts of said transmit or receive dictionary which have to be modified are saved in the empty locations associated with the addresses corresponding to the basic characters in said dictionary.

3. The method according to claim 1 wherein
  said step (a) includes also saving the parts of said transmit or receive dictionary which have to be modified by a dictionary updating operation; and
  said step (c) includes replacing in said transmit and receive dictionaries the parts of said dictionaries which have been modified during said dictionary updating operation by said saved parts determined by said saved addresses.

4. The method according to claim 1, 2 or 3, further comprising a step (b') of transmitting an acknowledgment from said receive device to said transmit device, said acknowledgment determining if said CRC check message corresponds to the contents of the updated receive dictionary (CRC OK).

5. The method according to claim 4 wherein said receive device also transmits a dictionary reinitializing command (REINIT) to said transmit device for it to perform said step (c) for said transmit dictionary at the same time said receive device performs the reinitializing operation for said receive dictionary.

6. The method according to claim 5 further comprising a step (d) of building a new check message (dictionary verify CRC) based upon the contents of said transmit dictionary after said dictionary reinitializing command (REINIT) has been performed and transmitting it from said transmit device to said receive device.

7. The method according to claim 6 wherein the resetting of said transmit and receive dictionaries is performed when said new check message (dictionary verify CRC) does not correspond to the contents of said receive dictionary after said step (c) has been performed.

8. The method according to claim 4, wherein step (b) is performed only after a predetermined number n of data frames have been transmitted from said transmit device to said receive device.

* * * * *